(12) United States Patent
Xu et al.

(10) Patent No.: US 9,873,940 B2
(45) Date of Patent: Jan. 23, 2018

(54) COATING SYSTEM AND METHOD FOR COATING INTERIOR FLUID WETTED SURFACES OF A COMPONENT OF A SEMICONDUCTOR SUBSTRATE PROCESSING APPARATUS

(71) Applicant: Lam Research Corporation, Fremont, CA (US)

(72) Inventors: Lin Xu, Katy, TX (US); Hong Shih, Walnut, CA (US); Nash Anderson, Cupertino, CA (US); Tom Stevenson, Morgan Hill, CA (US); John Daugherty, Fremont, CA (US); John Michael Kerns, Livermore, CA (US); Robert Griffith O'Neill, Hayward, CA (US)

(73) Assignee: Lam Research Corporation, Fremont, CA (US)

( * ) Notice: Subject to any disclaimer, the term of this patent is extended or adjusted under 35 U.S.C. 154(b) by 473 days.

(21) Appl. No.: 14/572,087

(22) Filed: Dec. 16, 2014

(65) Prior Publication Data

US 2015/0184296 A1   Jul. 2, 2015

Related U.S. Application Data

(60) Provisional application No. 61/922,196, filed on Dec. 31, 2013.

(51) Int. Cl.
*C23C 16/455* (2006.01)
*C23C 14/56* (2006.01)
(Continued)

(52) U.S. Cl.
CPC .......... *C23C 14/564* (2013.01); *C23C 16/045* (2013.01); *C23C 16/4402* (2013.01);
(Continued)

(58) Field of Classification Search
None
See application file for complete search history.

(56) References Cited

U.S. PATENT DOCUMENTS 4,990,372 A * 2/1991 Sunder .................... C23C 16/08
427/237
6,101,419 A    8/2000 Kennedy et al.
(Continued)

OTHER PUBLICATIONS

Shi Atomic Layer Depositoin System Design 2011.*
(Continued)

*Primary Examiner* — Joseph Miller, Jr.
(74) *Attorney, Agent, or Firm* — Beyer Law Group LLP (57) ABSTRACT

A coating system for forming an atomic layer deposition (ALD) or a molecular layer deposition (MLD) barrier coating on interior fluid wetted surfaces of a fluid handling component for a vacuum chamber of a semiconductor substrate processing apparatus. The coating system includes the fluid handling component, wherein the interior fluid wetted surfaces define a process region of the coating system, a gas supply system in fluid communication with the process region of the component wherein the gas supply system supplies process gases to the process region of the component through the inlet port thereof such that an ALD or MLD barrier coating can be formed on the fluid wetted surfaces of the fluid handling component, and an exhaust system in fluid communication with the process region of the component wherein the exhaust system exhausts the process gases from the process region of the component through the outlet port thereof.

9 Claims, 4 Drawing Sheets

(51) Int. Cl.
*C23C 16/04* (2006.01)
*C23C 16/44* (2006.01)

(52) U.S. Cl.
CPC .... *C23C 16/4404* (2013.01); *C23C 16/45525* (2013.01); *Y10T 29/41* (2015.01); *Y10T 428/263* (2015.01); *Y10T 428/31504* (2015.04); *Y10T 428/31551* (2015.04); *Y10T 428/31678* (2015.04); *Y10T 428/31721* (2015.04); *Y10T 428/31725* (2015.04); *Y10T 428/31786* (2015.04)

(56) References Cited

U.S. PATENT DOCUMENTS

| | | | |
|---|---|---|---|
| 6,283,143 B1 | 9/2001 | Adachi, Jr. et al. | |
| 6,406,273 B2 | 6/2002 | Wong | |
| 6,663,025 B1 | 12/2003 | Halsey et al. | |
| 6,720,259 B2 | 4/2004 | Londergan et al. | |
| 6,902,763 B1* | 6/2005 | Elers | C23C 16/34 257/E21.171 |
| 7,344,755 B2 | 3/2008 | Beaman et al. | |
| 7,363,727 B2 | 4/2008 | O'Donnell | |
| 7,517,803 B2 | 4/2009 | Ren et al. | |
| 7,914,847 B2 | 3/2011 | Verghese et al. | |
| 7,939,784 B2 | 5/2011 | Steger et al. | |
| 8,282,698 B2 | 10/2012 | Lenz | |
| 8,313,611 B2 | 11/2012 | Larson | |
| 8,491,967 B2 | 7/2013 | Ma et al. | |
| 8,503,151 B2 | 8/2013 | Comendant | |
| 8,623,456 B2 | 1/2014 | Yoon et al. | |
| 8,753,985 B2 | 6/2014 | Underwood et al. | |
| 8,778,812 B2 | 7/2014 | Furuya et al. | |
| 2003/0024477 A1* | 2/2003 | Okuda | C23C 16/345 118/723 IR |
| 2004/0023516 A1 | 2/2004 | Londergan et al. | |
| 2004/0045889 A1* | 3/2004 | Harkonen | B01D 45/06 210/304 |
| 2006/0040054 A1* | 2/2006 | Pearlstein | C23C 16/4404 427/248.1 |
| 2008/0063798 A1 | 3/2008 | Kher et al. | |
| 2010/0307415 A1 | 12/2010 | Shero et al. | |
| 2011/0056626 A1 | 3/2011 | Brown et al. | |
| 2012/0009343 A1 | 1/2012 | Van Ommen | |
| 2012/0305190 A1 | 12/2012 | Kang et al. | |
| 2013/0056087 A1 | 3/2013 | Taskar | |
| 2013/0233356 A1 | 9/2013 | Obweger et al. | |
| 2013/0248113 A1 | 9/2013 | Geissbühler et al. | |

OTHER PUBLICATIONS

Proof of date for Shi Atomic Layer Depositoin System Design 2011.*
BENEQ, "Hot wall reaction chamber". http://www.omeqa.com/pptst/SRT_heaters.html.
Putkonen, Matti et al., "Atomic layer deposition of polyimide thin films", J. Mater. Chem., 2007, 17, pp. 664-669.
Zhou, Han et al., "Fabrication of organic interfacial layers by molecular layer deposition: Present status and future opportunities", J. Vac. Sci. Technol., A31(4), Jul./Aug. 2013, pp. 040801-1-040801-18.

* cited by examiner

COATING SYSTEM AND METHOD FOR COATING INTERIOR FLUID WETTED SURFACES OF A COMPONENT OF A SEMICONDUCTOR SUBSTRATE PROCESSING APPARATUS

CROSS REFERENCE TO RELATED APPLICATION

This application claims priority under 35 U.S.C. §119(e) to U.S. Provisional Application No. 61/922,196, filed on Dec. 31, 2013, the entire content of which is incorporated herein by reference thereto.

FIELD OF THE INVENTION

This invention pertains to coatings formed by atomic layer deposition and molecular layer deposition, and may find particular use in coating interior fluid wetted surfaces of a fluid handling component for a vacuum chamber of a semiconductor substrate processing apparatuses.

BACKGROUND

Semiconductor substrate processing apparatuses are used to process semiconductor substrates by techniques including etching, physical vapor deposition (PVD), chemical vapor deposition (CVD), plasma enhanced chemical vapor deposition (PECVD), atomic layer deposition (ALD), plasma enhanced atomic layer deposition (PEALD), pulsed deposition layer (PDL), molecular layer deposition (MLD), plasma enhanced pulsed deposition layer (PEPDL) processing, and resist removal. Semiconductor substrate processing apparatuses, such as the aforementioned processing apparatuses, can comprise a plurality of interrelated, but discrete, fluid handling components that can be used to transform a group of semiconductor substrates from an unfinished state to a completed state with applied microcircuitry. Such fluid handling components can include interior fluid wetted surfaces which are exposed to corrosive and/or erosive process gases. Accordingly, it is desirable that such interior fluid wetted surfaces of such fluid handling components be resistant to corrosion and/or erosion when exposed to respective process gases or process fluids.

SUMMARY

Disclosed herein is a coating system for forming an atomic layer deposition (ALD) barrier coating or a molecular layer deposition (MLD) barrier coating on interior fluid wetted surfaces of a fluid handling component for a vacuum chamber of a semiconductor substrate processing apparatus. The interior fluid wetted surfaces between an inlet port and an outlet port of the fluid handling component wherein the interior fluid wetted surfaces contact process fluid during processing of a semiconductor substrate in the vacuum chamber of the semiconductor substrate processing apparatus. The coating system includes the fluid handling component, wherein the interior fluid wetted surfaces define a process region of the coating system. A gas supply system is in fluid communication with the process region of the fluid handling component wherein the gas supply system supplies process gases to the process region of the fluid handling component through the inlet port thereof such that an ALD or MLD barrier coating can be formed on the fluid wetted surfaces of the fluid handling component. An exhaust system is in fluid communication with the process region of the fluid handling component wherein the exhaust system exhausts the process gases from the process region of the fluid handling component through the outlet port thereof.

Also disclosed herein is a fluid handling component for a vacuum chamber of a semiconductor substrate processing apparatus. The fluid handling component comprises interior fluid wetted surfaces and an atomic layer deposition (ALD) or molecular layer deposition (MLD) barrier coating on the interior fluid wetted surfaces wherein the fluid wetted surfaces which include the ALD or MLD barrier coating are configured to be contacted by a process gas and/or fluid during a semiconductor substrate processing process wherein the ALD or MLD barrier coating protects the underlying fluid wetted surfaces from erosion and/or corrosion.

Further disclosed herein is a method of forming an atomic layer deposition (ALD) or molecular layer deposition (MLD) barrier coating on interior fluid wetted surfaces of a fluid handling component for a vacuum chamber of a semiconductor substrate processing apparatus wherein the interior fluid wetted surfaces of the fluid handling component form a process region for forming the ALD or MLD barrier coating. The method comprises sequentially injecting atomic layer deposition gases or molecular layer deposition gases into an inlet port of the fluid handling component with a gas supply system and forming an ALD or MLD barrier coating on the interior fluid wetted surfaces, and sequentially exhausting the atomic layer deposition gases or the molecular layer deposition gases from an outlet port of the component with an exhaust system.

DETAILED DESCRIPTION

In the following detailed description, numerous specific embodiments are set forth in order to provide a thorough understanding of the apparatus and methods disclosed herein. However, as will be apparent to those skilled in the art, that the present embodiments may be practiced without these specific details or by using alternate elements or processes. In other instances, well-known processes, procedures, and/or components have not been described in detail so as not to unnecessarily obscure aspects of embodiments disclosed herein. As used herein the term "about" refers to ±10%.

Disclosed herein is a coating system (as used herein an ALD or MLD apparatus) for forming an atomic layer deposition (ALD) barrier coating or a molecular layer deposition (MLD) barrier coating on interior fluid wetted surfaces of a fluid handling component for a vacuum chamber of a semiconductor substrate processing apparatus. The interior fluid wetted surfaces between an inlet port and an outlet port of the fluid handling component wherein the interior fluid wetted surfaces contact process fluid during processing of a semiconductor substrate in the vacuum chamber of the semiconductor substrate processing apparatus. The coating system includes the fluid handling component, wherein the interior fluid wetted surfaces define a process region of the coating system. A gas supply system is in fluid communication with the process region of the fluid handling component wherein the gas supply system supplies process gases to the process region of the fluid handling component through the inlet port thereof such that an ALD or MLD barrier coating can be formed on the fluid wetted surfaces of the fluid handling component. An exhaust system is in fluid communication with the process region of the fluid handling component wherein the exhaust system exhausts the process gases from the process region of the fluid handling component through the outlet port thereof.

Semiconductor substrate processing apparatuses can comprise a plurality of interrelated, but discrete, fluid handling components which can be upstream, downstream, or inside of the vacuum chamber of the semiconductor substrate processing apparatus wherein the processing apparatus is used to process a semiconductor substrate supported in a reactor space of the vacuum chamber. For example, such fluid handling components can include, but are not limited to, an exhaust assembly such as disclosed in commonly-assigned U.S. Published Application No. 2013/0248113, a gas delivery system such as disclosed in commonly-assigned U.S. Published Application No. 2013/0305190, a gas box such as disclosed in commonly-assigned U.S. Pat. No. 6,101,419, a gas stick such as disclosed in commonly-assigned U.S. Published Application No. 2013/0056087 or U.S. Pat. No. 6,283,143, a proximity head such as disclosed in commonly-assigned U.S. Pat. No. 7,363,727, a liquid-dispensing device (fluid delivery system) comprising an array of liquid-dispensing nozzles such as disclosed in commonly-assigned U.S. Published Application No. 2013/233356, an air filtering unit and/or exhaust system such as disclosed in commonly-assigned U.S. Pat. No. 8,282,698, a deionized water pressure system and corresponding facility lines such as those disclosed in commonly-assigned U.S. Pat. No. 6,406,273, a gas distribution system including a gas switching section such as disclosed in commonly-assigned U.S. Published Application No. 2012/0070997, a temperature controlled member such as a temperature controlled top plate disclosed in commonly-assigned U.S. Pat. No. 7,517,803, or a temperature controlled base plate disclosed in commonly-assigned U.S. Pat. No. 7,939,784, and/or a diffuser such as disclosed in commonly-assigned U.S. Pat. No. 6,663,025, all of which are hereby incorporated by reference in their entirety.

Figure 3:
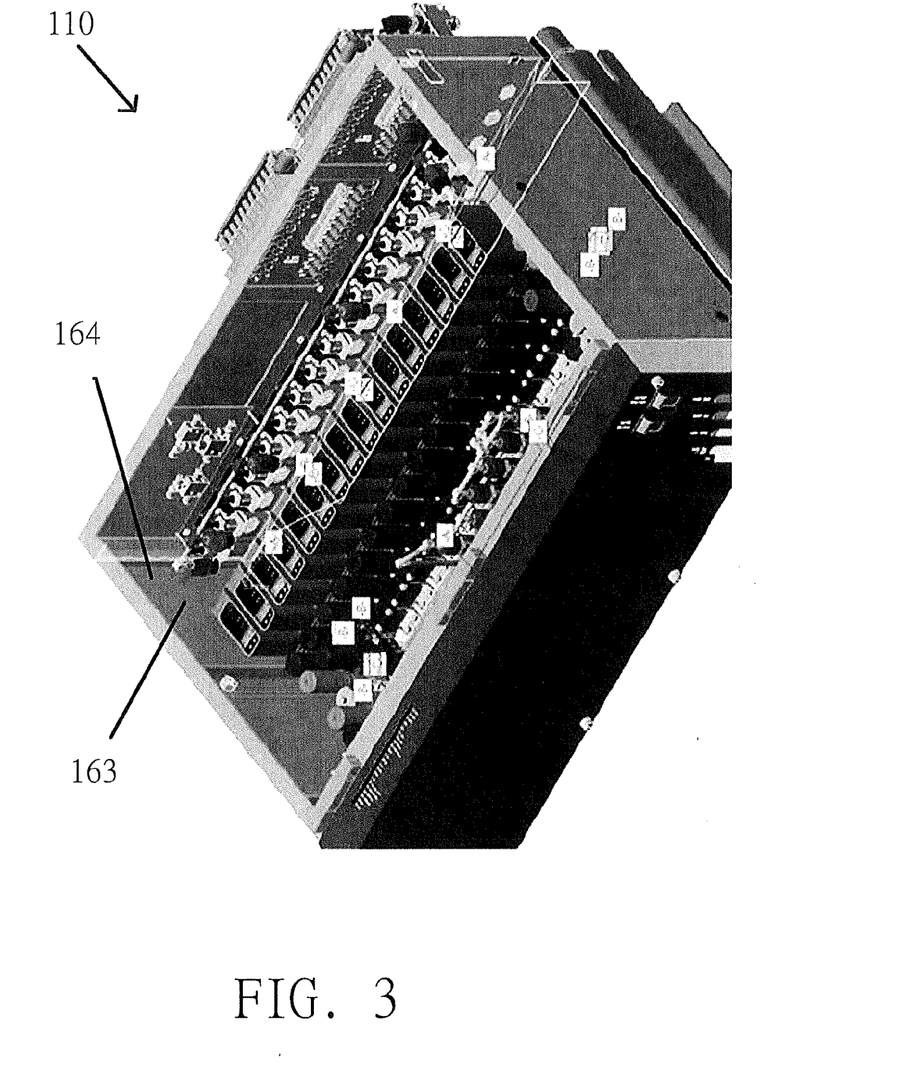
FIG. 3 illustrates an exemplary fluid handling component according to embodiments disclosed herein.

Such fluid handling components include interior fluid wetted surfaces therein wherein erosive and/or corrosive process gases and/or fluids can cause deterioration of the interior fluid wetted surfaces and/or cause contaminants from the interior fluid wetted surfaces to be released into the vacuum chamber (i.e. processing environment or reactor space) of the semiconductor substrate processing apparatus, thereby causing processing defects and/or substrate contamination of a semiconductor substrate during semiconductor substrate processing. For example, iron containing parts of fluid handling components at the upstream of a vacuum chamber (exposed to high-pressure corrosive gases) and at the downstream of the vacuum chamber (exposed to low-pressure gas and possibly radicals) can cause substrate contamination when erosive and/or corrosive process gases and/or liquids interact with the interior fluid wetted surfaces releasing iron into the vacuum chamber, thus leading to iron contamination of the semiconductor substrate being processed. In contrast to components of vacuum chambers, which tend to have simple geometry, iron containing components (contributing to substrate contamination) of downstream or upstream fluid handling components, are very hard to be clearly identified, let alone fix. This is because there are too many components included in the fluid handling components with irregular geometries and too many components included in the fluid handling components which could degrade under high temperature coating processes. For example, iron-free Si CVD coatings can require temperatures of about 400° C. to apply wherein components of fluid handling components such as a spring-like diaphragm material (Co—Ni alloys)/O-rings/plastic handles of a gas valve within a gas box (as illustrated in FIG. 3) could not survive at coating temperatures of about 400° C.

Figure 1:
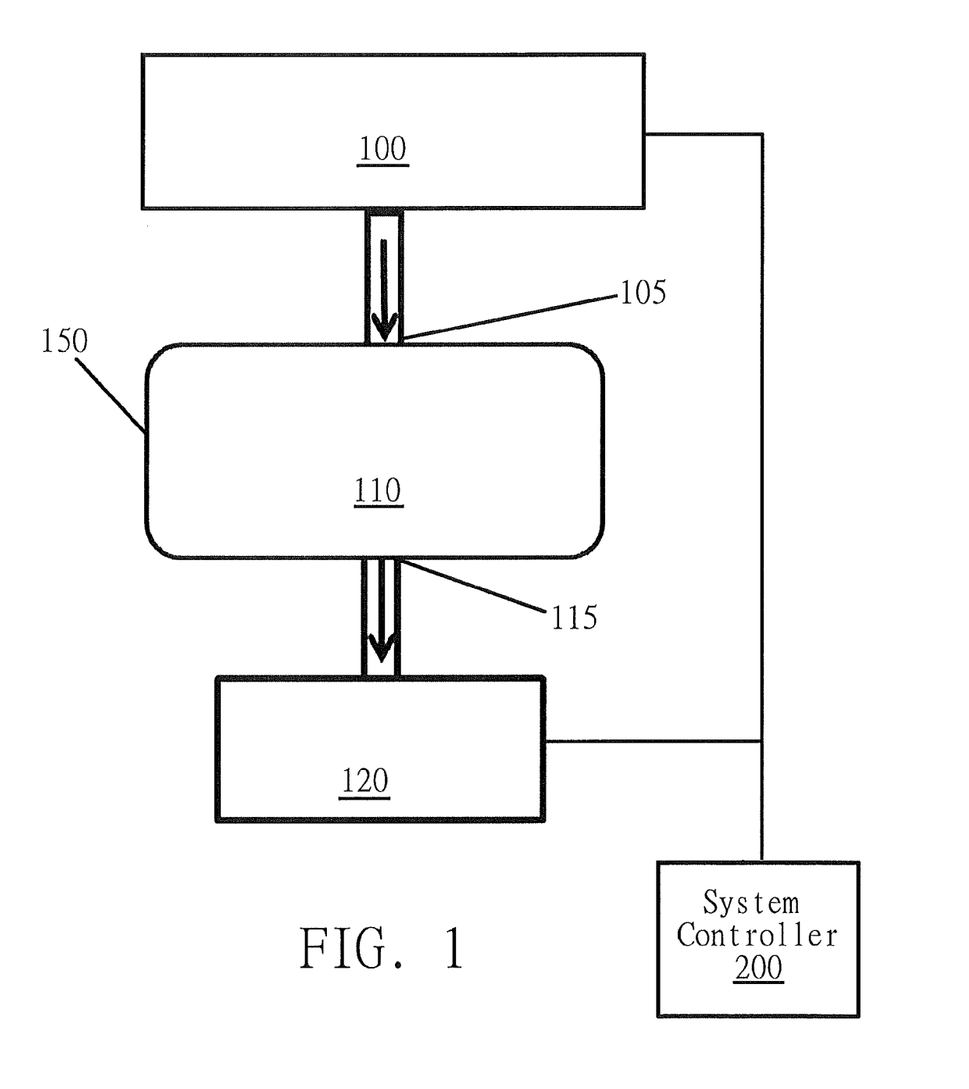
FIG. 1 illustrates an exemplary coating system according to embodiments disclosed herein.

To alleviate contaminates from interior fluid wetted surfaces of fluid handling components, whole upstream or downstream fluid handling components are pre-assembled, vacuum sealed, and configured to form a process space of an atomic layer deposition (ALD) apparatus or a molecular layer deposition (MLD) apparatus wherein ALD or MLD barrier coatings can be formed on the interior fluid wetted surfaces of the fluid handling components. FIG. 1 illustrates an embodiment of a coating system for forming an ALD or MLD barrier coating on interior fluid wetted surfaces of a fluid handling component. To form the ALD or MLD barrier coating on the interior fluid wetted surfaces of a fluid handling component 110, ALD or MLD coating gases are injected from an ALD or MLD precursor gas delivery system 100 (gas supply system) through an inlet port 105 of the fluid handling component 110 and exhausted through an outlet port 115 of the fluid handling component 110 by an exhaust system 120. The fluid handling component is then removed from the auxiliary ALD precursor gas delivery system 100 and the exhaust system 120. When disconnected from the gas delivery system and the exhaust system, the whole fluid handling component, having an ALD or MLD barrier coating on the interior fluid wetted surfaces thereof can be installed upstream, downstream, or in a vacuum chamber of a semiconductor substrate processing apparatus wherein the ALD or MLD barrier coating of the fluid handling component will reduce contamination, such as metal contamination, therefrom.

The method of forming the ALD or MLD barrier coating on interior fluid wetted surfaces of the fluid handling component includes sequentially injecting atomic layer deposition gases or molecular layer deposition gases into an inlet port 105 of the fluid handling component 110 with the gas supply system 100 thereby forming an ALD or MLD barrier coating on the interior fluid wetted surfaces of the fluid handling component 100 and sequentially exhausting the atomic layer deposition gases or the molecular layer deposition gas from an outlet port 115 of the component 110 with an exhaust system wherein the interior fluid wetted surfaces of the fluid handling component form a process region for forming the ALD or MLD barrier coating. For example, the method can include injecting a pulse of a first reactant gas on the interior fluid wetted surfaces of the fluid handling component, and injecting a pulse of a second reactant gas on the interior fluid wetted surfaces of the fluid handling component to react with the first reactant gas to form a layer of the ALD or MLD barrier coating on the interior fluid wetted surfaces of the fluid handling component wherein the method preferably includes repeating each injection step a plurality of times. The method also includes exhausting excess first reactant gas with the exhaust system after injecting the pulse of the first reactant gas, and exhausting excess second reactant gas and reaction byproduct(s) with the exhaust system after dispensing the pulse of the second reactant gas. Preferably the first and second reactant gases are injected into the fluid handling component forming layers of the ALD or MLD barrier coating on the interior fluid wetted surfaces of the fluid handling component until the coating is formed to a desired thickness.

In a preferred embodiment, the method includes injecting a pulse of a first reactant gas on the interior fluid wetted surfaces of the fluid handling component, and then injecting a first pulse of purging gas on the interior fluid wetted surfaces of the fluid handling component to purge excess first reactant gas from interior fluid wetted surfaces and the fluid handling component. The method includes injecting a pulse of a second reactant gas on the interior fluid wetted surfaces of the fluid handling component to react with the first reactant gas to form a layer of the ALD or MLD barrier coating on the interior fluid wetted surfaces of the fluid handling component, and injecting a second pulse of purging gas on the interior fluid wetted surfaces of the fluid handling component to remove excess second reactant gas and reaction byproduct(s) from the interior fluid wetted surfaces and the fluid handling component. The method also preferably includes exhausting excess first reactant gas with the exhaust system after injecting the pulse of the first reactant gas, exhausting excess first pulse of purging gas with the exhaust system after injecting the first pulse of the purging gas, exhausting excess second reactant gas and reaction byproduct(s) with the exhaust system after dispensing the pulse of the second reactant gas, and exhausting excess second pulse purging gas with the exhaust system after injecting the second pulse of the purging gas.

Coatings deposited by an ALD or MLD process tend to have higher purity and better conformality to microfeature topography than analogous films deposited via CVD. In addition, ALD and/or MLD processes are often carried out a lower temperature than CVD processes to deposit analogous materials, thereby reducing thermal stresses on individual components which make up the fluid handling component having the interior fluid wetted surfaces. For example, an $Al_2O_3$ ALD coating can be applied at temperatures as low as about 50° C. (typical range is about 50° C. to 300° C.). In alternate embodiments, ALD or MLD coatings can be formed at about room temperature. This enables the coating of all of the interior fluid wetted surfaces of the fluid handling component without "frying" components included in the fluid handling component such as O-rings, MFCs, gaskets, and/or valves. In an embodiment, the fluid handling component 110 can be disposed in an oven (not shown) such that the temperature of the interior fluid wetted surfaces of the fluid handling component 110 can be increased to a desired temperature such that the ALD or MLD barrier coating process can be performed. In a preferred embodiment, one or more heaters 150 can be arranged to be in thermal contact with the fluid handling component 110 such that the one or more heaters 150 can increase the temperature of the interior fluid wetted surfaces of the fluid handling component 110 to a desired temperature. The one or more heaters 150 can be, for example, a heater (i.e. a heater tape) which includes resistance wire therein wherein the heater is disposed on a surface of the fluid handling component 110, a heating lamp arranged to heat the fluid handling component 110, or the like.

Figure 2:
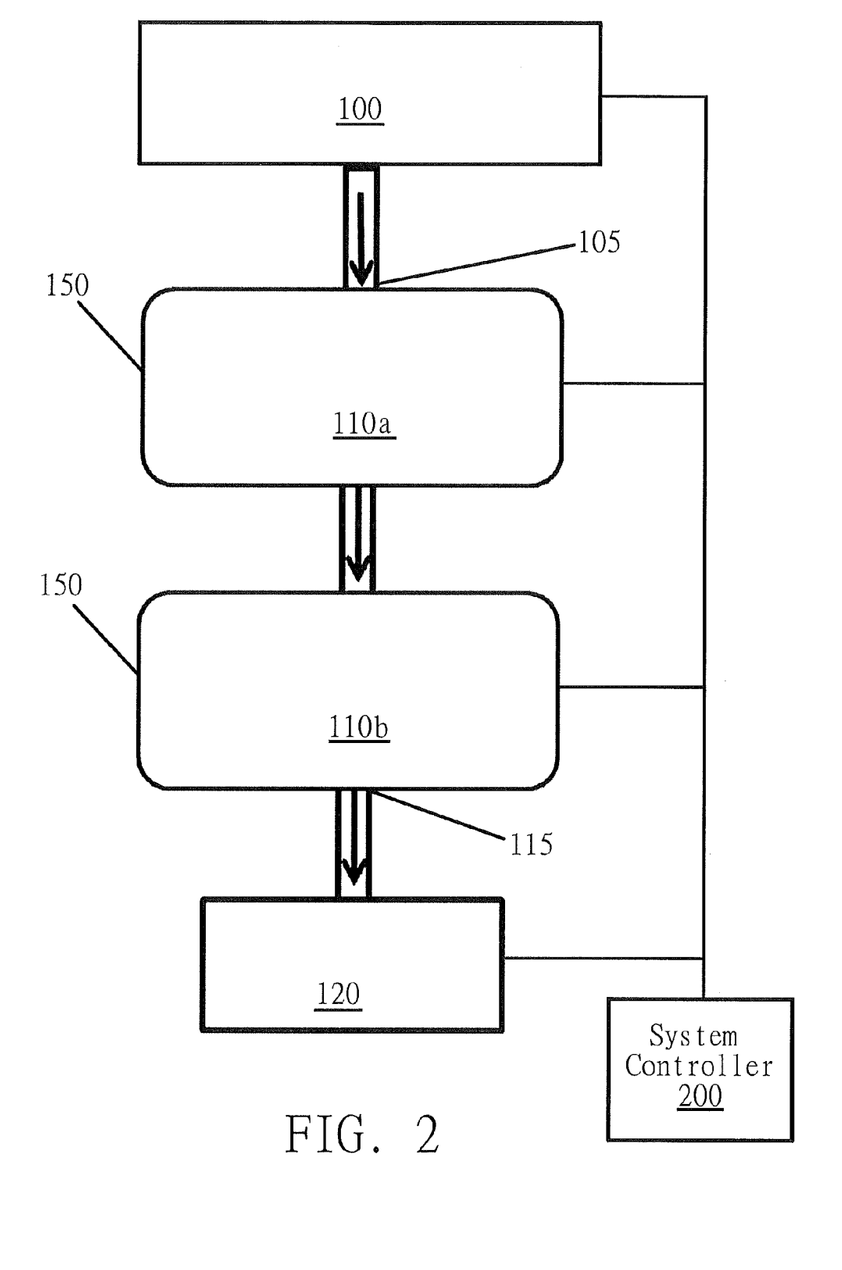
FIG. 2 illustrates an exemplary coating system according to embodiments disclosed herein.

In a preferred embodiment, multiple fluid handling components which each include interior fluid wetted surfaces are in fluid communication with each other such that the interior of each fluid handling component forms the process region of the ALD or MLD apparatus (i.e. coating system). In this manner, an ALD or MLD barrier coating can be formed on interior fluid wetted surfaces of each fluid handling component at the same time. For example, to form an ALD or MLD barrier coating on the interior fluid wetted surfaces of a first fluid handling component 110a and a second fluid handling component 110b, ALD coating gases are injected from an ALD or MLD precursor gas delivery system 100 (gas supply system) through an inlet port 105 of the first fluid handling component 110a and exhausted through an outlet port 115 of the second fluid handling component 110b by an exhaust system 120 wherein the first fluid handling component 110a and the second fluid handling component 110b are in fluid communication with one another, as illustrated in FIG. 2. The fluid handling components 110a, 110b can then be removed from the gas supply system 100 and the exhaust system 120 wherein the assemblies 110a, 110b can be installed on the same or different semiconductor substrate processing apparatuses such as a vacuum chamber of a plasma etching apparatus or a deposition apparatus. Preferably, in this manner, two or more fluid handling components are coated at the same time.

Methods of forming ALD or MLD barrier coatings allow coatings to grow layer-by-layer in a highly precise and controllable fashion. Therefore, the thickness of ALD or MLD barrier coatings formed on the interior fluid wetted surfaces of the fluid handling components can be tailored as needed and applied conformally and uniformly over the interior fluid wetted surfaces of the fluid handling component, consequently eliminating the risks of undesired modification of part dimensions of components making up the fluid handling components, for example, such as an o-ring. Further, ALD and MLD processes can deposit pinhole free barrier coatings, thus leading to complete coverage of the interior fluid wetted surfaces of the fluid handling components. A variety of inert materials, such as oxide/nitride/fluoride materials, can be deposited by ALD processes with high coating adhesion on various interior fluid wetted surfaces such as metal surfaces, ceramic surfaces, or temperature-sensitive polymer surfaces of the fluid handling components. In a preferred embodiment, the ALD barrier coating is formed from $Al_2O_3$. In alternate embodiments, the ALD coating can include at least one of tantalum (Ta), titanium (Ti), tungsten (W), zirconium (Zr), hafnium (Hf), molybdenum (Mo), niobium (Nb), vanadium (V), ruthenium (Ru) and/or chromium (Cr) and mixtures and/or alloys thereof. In an alternate preferred embodiment, the MLD barrier coating is an organic, or an organic-inorganic hybrid material. For example, the MLD barrier coating can be a polyamide, a polyimide, a polyuria, a polythiourea, a polyurethane, a polyazomethine, or a polyester material. In a preferred embodiment, the ALD or MLD barrier coating has a thickness of about 0.1 to 500 nm or greater, wherein the ALD or MLD barrier coating preferably has a thickness of about 10 nm or greater and more preferably about 100 nm or greater.

In a preferred embodiment, only the interior fluid wetted surfaces of the fluid handling components will be coated. The interior fluid wetted surfaces can be any interior surface of the fluid handling component wherein the interior of the fluid handling component forms the process region of the ALD or MLD apparatus. Preferably, vacuum seals included in the fluid handling component (i.e. gaskets and O-rings) serve as hard masks to prevent the coating of external surfaces (i.e. non fluid wetted surfaces) of the fluid handling component. In certain embodiments, barrier coatings on the external surfaces of fluid handling components can lead to process errors, and therefore are preferably avoided. For example, ALD coatings of insulative material on gas weldment exteriors could interfere with a RF grounding path of the weldment and possibly lead to light-up of process gas in the weldment.

Figure 4:
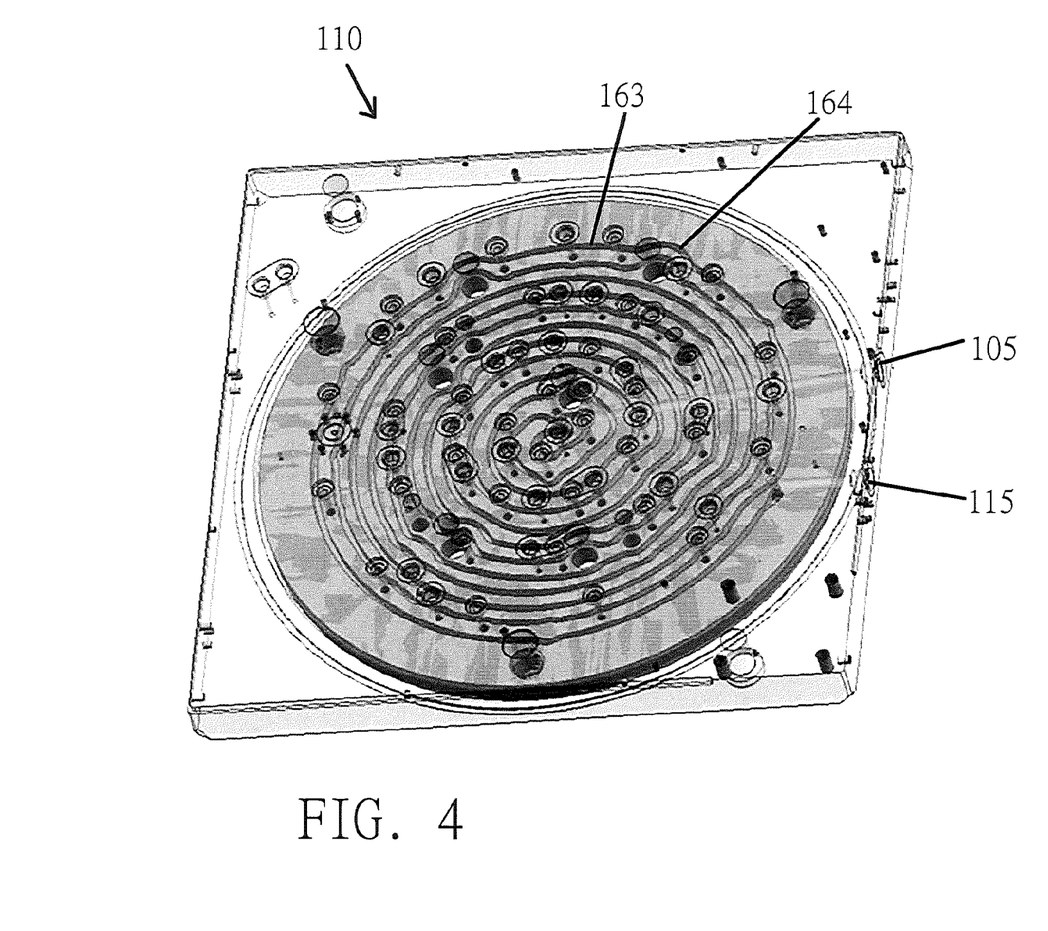
FIG. 4 illustrates an exemplary fluid handling component according to embodiments disclosed herein.

FIGS. 3 and 4 each illustrate an exemplary fluid handling component which can include the ALD or MLD barrier coating on interior fluid wetted surfaces thereof. FIG. 3 illustrates a cross section of a gas box 110 wherein the interior of the gas box forms the process region of the ALD or MLD apparatus and wherein the interior of the gas box forms the interior fluid wetted surfaces 163 of the gas box which includes an ALD or MLD barrier coating 164 thereon. FIG. 4 illustrates a temperature controlled top plate 110 which includes a coolant inlet port 105 and a coolant outlet port 115 for circulating the coolant (e.g. deionized water) through a passage thereof. The passage forms the interior of the fluid handling component wherein the interior fluid wetted surfaces 163 of the passage includes the ALD or MLD barrier coating 164 thereon.

An operator can control the formation of the ALD or MLD barrier coating through interaction with a system controller 200 such as a monitor and a data entry device such as the keyboard. The system controller 200 is employed to control process conditions during deposition, post deposition treatments, and/or other process operations. The controller 200 will typically include one or more memory devices and one or more processors. The processor may include a CPU or computer, analog and/or digital input/output connections, stepper motor controller boards, etc.

In certain embodiments, the controller 200 controls all of the activities of the ALD or MLD apparatus (i.e. coating system). The system controller 200 executes system control software including sets of instructions for controlling the ALD or MLD barrier coating process, flow rates, exhaust rates, and temperatures of reactant and inert gases and their relative mixing, temperature of the one or more heaters 150, pressure in the interior of the fluid handling component 110, and other parameters of the coating process. Other computer programs stored on memory devices associated with the controller may be employed in some embodiments.

Typically there will be a user interface associated with controller 200. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the ALD or MLD apparatus (i.e. coating system). The computer program code for controlling the processing operations can be written in any conventional computer readable programming language: for example, assembly language, C, C++, Pascal, Fortran or others. Compiled object code or script is executed by the processor to perform the tasks identified in the program.

Signals for monitoring the process may be provided by analog and/or digital input connections of the system controller. The signals for controlling the process are output on the analog and digital output connections of the apparatus.

While the coating system and method of forming an ALD or MLD barrier coating on interior surfaces of a fluid handling component have been described in detail with reference to specific embodiments thereof, it will be apparent to those skilled in the art that various changes and modifications can be made, and equivalents employed, without departing from the scope of the appended claims.

What is claimed is:

1. A method of providing a fluid handling component with an atomic layer deposition (ALD) or molecular layer deposition (MLD) barrier coating on interior fluid wetted surfaces of the fluid handling component wherein the interior fluid wetted surfaces of the fluid handling component form a process region for depositing the ALD or MLD barrier coating, the method comprising:
   pre-assembling a plurality of components to form the fluid handling component having an inlet port and an outlet port, wherein the fluid handling component is connected through the inlet port to a gas supply system on a first end of the fluid handling component and an exhaust system is connected on a second end of the fluid handling system;
   sequentially injecting atomic layer deposition gases or molecular layer deposition gases from the gas supply system into the inlet port of the fluid handling component;
   providing an ALD or MLD process to form the ALD or MLD barrier coating on the interior fluid wetted surfaces; and
   sequentially exhausting the atomic layer deposition gases or the molecular layer deposition gases from an the outlet port with an the exhaust system; and
   disconnecting the fluid handling component from the gas supply and the exhaust system;
   wherein the fluid handling component is installed upstream, downstream, or in a vacuum chamber of a semiconductor substrate processing apparatus.

2. The method of claim 1, wherein the sequentially injecting atomic layer deposition gases or molecular layer deposition gases from the gas supply system into the inlet port of the fluid handling component comprises:
   (a) injecting a pulse of a first reactant gas on the interior fluid wetted surfaces of the fluid handling component; and
   (b) injecting a pulse of a second reactant gas on the interior fluid wetted surfaces of the fluid handling component to react with the first reactant gas to form a layer of the ALD or MLD barrier coating on the interior fluid wetted surfaces of the fluid handling component; or
   (c) repeating (a) and (b) at least twice.

3. The method of claim 2, further comprising:
   (a) exhausting excess first reactant gas with the exhaust system through the outlet port after injecting the pulse of the first reactant gas; and
   (b) exhausting excess second reactant gas and reaction byproduct(s) with the exhaust system through the outlet port after injecting the pulse of the second reactant gas; or
   (c) repeating (a) exhausting excess first reactant gas and (b) exhausting excess second reactant gas at least twice.

4. The method of claim 1, further comprising:
   (a) heating the interior fluid wetted surfaces of the fluid handling component to a predetermined temperature while forming the ALD or MLD barrier coating on the interior fluid wetted surfaces; and/or
   (b) vacuum sealing the interior fluid wetted surfaces of the fluid handling component before forming the ALD or MLD barrier coating.

5. The method of claim 1, wherein the pre-assembling the plurality of components further comprises arranging multiple fluid handling components such that the interior fluid wetted surfaces of each fluid handling component are in fluid communication with each other and the ALD or MLD barrier coating can be formed on the interior fluid wetted surfaces of each respective fluid handling component.

6. The method of claim 1,
wherein when the fluid handling component is mounted as part of the vacuum chamber of the semiconductor substrate processing apparatus, the interior fluid wetted surfaces of the fluid handling component are not exposed to a reactor space of the vacuum chamber.

7. The method, as recited in claim 1, wherein the pre-assembling the plurality of components comprises vacuum sealing the plurality of components, wherein the ALD or MLD barrier coating forms a layer over the vacuum sealing.

8. The method, as recited in claim 7, wherein the vacuum sealing of the plurality of components uses at least one O-ring between two of the plurality of components.

9. The method, as recited in claim 1, wherein the ALD or MLD barrier coating is only formed on the interior fluid wetted surfaces of the fluid handling component.

\* \* \* \* \*